United States Patent [19]

Böhme

[11] E Patent Number: Re. 32,479

[45] Reissued Date of Patent: Aug. 18, 1987

[54] FEEDBACK AMPLIFIER OR THRESHOLD VALUE SWITCH FOR A CURRENT FEED DIFFERENTIAL STAGE

[75] Inventor: Rolf Böhme, Bad Friedrichshall, Fed. Rep. of Germany

[73] Assignee: Telefunken electronic GmbH, Heibronn, Fed. Rep. of Germany

[21] Appl. No.: 801,949

[22] Filed: Nov. 26, 1985

Related U.S. Patent Documents

Reissue of:

[64] Patent No.: 4,418,321
Issued: Nov. 29, 1983
Appl. No.: 296,484
Filed: Aug. 26, 1981

[51] Int. Cl.[4] ..... H03F 3/45

[52] U.S. Cl. ..... 330/261; 330/352

[58] Field of Search ..... 330/70, 71, 73, 252, 330/260, 261, 303, 306, 307

[56] References Cited

U.S. PATENT DOCUMENTS 3,408,533 10/1968 Gates ..... 330/252
4,547,744 10/1985 Kasperkovitz ..... 330/252

OTHER PUBLICATIONS

Hurley, "Junction Transistor Electronics", 1958, pp. 425, 434.

*Primary Examiner*—Gene Wan
*Attorney, Agent, or Firm*—Spencer & Frank

[57] ABSTRACT

A feedback amplifier which is constructed as a threshold value switch includes a current fed differential stage and additionally comprises two transistors whose emitters are each connected to one output of the differential stage with a first resistor connected between these two outputs and second and third resistors forming operating resistors connected between the supply voltage and the two transistors, each operating resistor being connected to the collector of one transistor and the base of the other transistor respectively.

8 Claims, 3 Drawing Figures

FEEDBACK AMPLIFIER OR THRESHOLD VALUE SWITCH FOR A CURRENT FEED DIFFERENTIAL STAGE

Matter enclosed in heavy brackets [ ] appears in the original patent but forms no part of this reissue specification; matter printed in italics indicates the additions made by reissue.

BACKGROUND OF THE INVENTION

The invention relates to a feedback amplifier which can be constructed to operate as a threshold value switch for a current-fed differential stage.

SUMMARY OF THE INVENTION

It is an object of the invention to provide a feedback amplifier which can be constructed to operate as a threshold value switch which is connected to a current-fed differential stage, has simplified circuit connections and low output loss and is easily integrated.

According to the invention, there is provided a feedback amplifier including a current feed differential stage and additionally comprising a first transistor having an emitter connected to a first output of said differential stage, a second transistor having an emitter connected to a second output of said differential stage, a first resistor connected between both said first and second outputs of said differential stage, a second resistor forming an operating resistor connected between a supply voltage and the collector of said first transistor and the base of said second transistor and a third resistor forming an operating resistor connected between said supply voltage and the collector of said second transistor and the base of said first transistor.

Further according to the invention, there is provided a feedback amplifier or threshold value switch for a current-fed differential stage, in which the first output of the differential stage is connected to the emitter of a first transistor and a second output is connected to the emitter of the second transistor 2; a first resistor is connected between both said outputs; second and third resistors comprising operating resistors connected to the supply voltage are provided and the second resistor is connected to the collector of the first transistor and the base of the second transistor and the third resistor is connected to the collector of the second transistor and the base of the first transistor.

BRIEF DESCRIPTION OF THE DRAWINGS

The invention will now be described in greater detail, by way of example, with reference to the drawings, in which.

DESCRIPTION OF THE PREFERRED EMBODIMENTS

Figure 1:
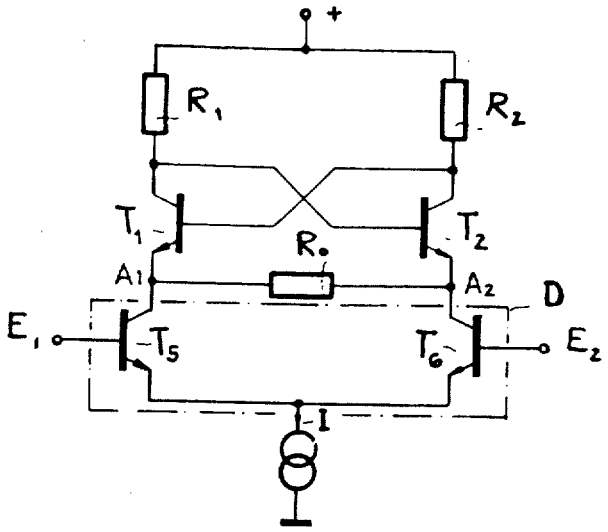
FIG. 1 is a circuit diagram of one embodiment of the invention illustrating the basic concept thereof.

FIG. 1 illustrates the basic concept in which a feedback amplifier or threshold value switch for a current fed differential stage D has a first output A1 of the differential stage D connected to the emitter of a first transistor T1 and the second output A2 connected to the emitter of a second transistor T2 and a resistor R0 connected between *the* two *differential stage* outputs A1 and A2 and two operating resistors R1,R2 connected to the supply voltage, the first operating resistor R1 being connected to the collector of the first transistor T1 and the base of the second transistor T2 and the second operating resistor R2 being connected to the collector of the second transistor T2 and the base of the first transistor T1, *with the collectors of transistors T1 and T2 forming the output of the feedback amplifier.*

In contrast to a suggestion shown in German Auslegeschrift No. 1903913, the circuit arrangement according to the invention does not require any additional supply current.

In the circuit in accordance with the invention, any desired current amplification from one to infinity may be set. In addition this circuit is able to fulfil the function of a threshold value switch with any desired hysteresis. In comparison to the circuit shown in German Auslegeschrift No. 2024806 the invention has the advantage that the output current retain its saturation value after it has reached its overload condition and does not change to the other operating resistor.

According to a further refinement of the invention, the base of the first transistor T1 is connected via a resistor R4 to the collector of the second transistor T2 and the base of second transistor T2 is connected via a resistor R3 to the collector of the first transistor T1. A resistor R5 or R6 respectively is inserted in each case between the base and emitter of the first or second transistors T1, T2 respectively.

Another refinement of the invention lies in that in each case a transistor T3, T4 operating as emitter follower is connected in front of the base of the first transistor T1 and the base of the second transistor T2. This occurs in the normal case so that the base of the first transistor T1 is connected to the emitter of the fourth transistor T4 and the base of the second transistor T2 is connected to the emitter of the third transistor T3 so that the collectors of the third and fourth transistors T3 and T4 are connected to the supply voltage and so that the base of the third transistor T3 is connected to the collector of the first transistor T1 and the base of the fourth transistor T4 is connected to the collector of the second transistor T2.

The embodiments shown in the drawings will now be described in greater detail.

FIG. 1 shows a feedback amplifier in which its related differential stage D comprises the bipolar transistors T5 and T6, for example, and is fed by a current source 1 of any desired type. According to the difference in the potentials at the input terminals E1 and E2 and therefore at the bases of the transistors T5 and T6, the current from the current source I is distributed between the two outputs A1 and A2 *of the differential stage D* at the collectors of the transistors T5 and T6. Without R0 between A1 and A2, the two partial currents through the transistors T1 and T2 would remain almost unchanged, flowing into the operating resistors R1, R2 as long as the base current of the two transistors T1 and T2 remain low. If the differential stage D is controlled so that the current in the *differential stage* output A1 is greater and the current in the *differential stage* output A2 is less, then the voltage drop [access] *across* R1 increases and decreases across R2. As a result of the cross coupling of the transistors T1, T2, the changes in voltage across the base emitter paths of the transistors T1 and T2 are passed on to the outputs A1 and A2 of the differential stage D. Whereas the potential at the collector of T1 drops the potential at the emitter of T1 rises. The current flowing through R0 is added to the current caused by the input signal and results in an increase in current amplification. If the resistor R0 is equal to the sum of the operating resistors R1 and R2 minus the reciprocals of the two transistor admittances, then the amplification is infinite. This means that the current from the current source 1 changes over abruptly at a certain value of the input voltage effective between the input terminals[:] E1 and E2, from one of the operating resistors R1 or [R1,] *R2* to the other. Other reductions in the resistance R0 result in the point at which there is switch over of the current for rising input voltage being distinguished from the point at which there is switch over of the current for falling input voltage. Thus the nature of a threshold value circuit is given. The spacing between the switch over points may be adjusted as described according to the selection of R0.

Figure 2:
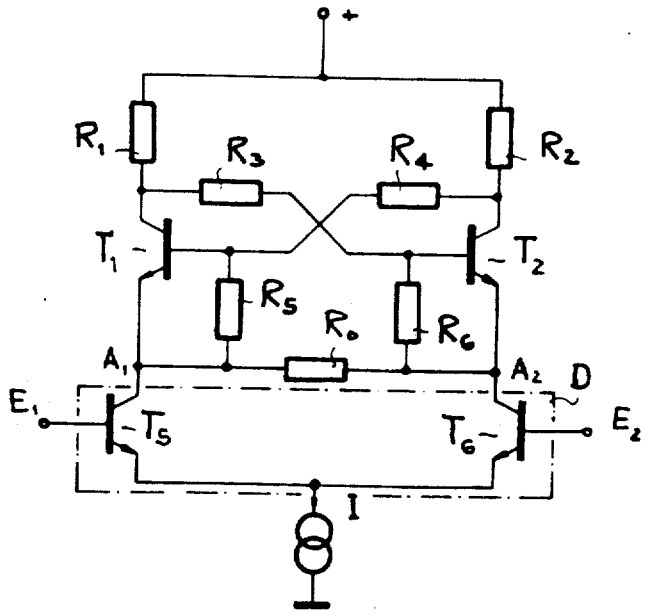
FIG. 2 is a circuit diagram of a modified form of circuit in accordance with the invention.

In the circuit according to FIG. 1 the collector potential of the transistors T1, T2 is approximately equal to the base potential. This means that only small amounts of modulation are possible and the transistors can easily become saturated. Therefore provision is made (FIG. 2) for resistors R3 or R4 respectively to be connected in front of the bases of the first and second transistor T1 or T2 respectively. The voltage drop across these resistors ensures a collector potential which is increased as compared to the base. Two other resistors R5 and R6 which are connected in each case between the base and the emitter of the first and second transistors T1 and T2 form voltage dividers with the resistors R3 and R4, the operating points of the first and second transistors T1 and T2 being optimally fixed to the voltage dividers.

Figure 3:
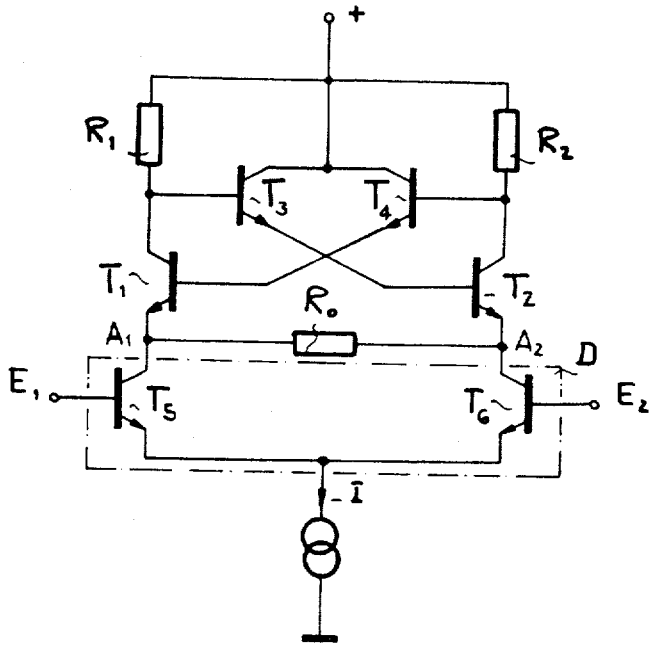
FIG. 3 is a circuit diagram of a second modified form of circuit in accordance with the invention.

The circuit arrangement of FIG. 3 differs from the circuit arrangement of FIG. 1 in that the bases of the transistors T1 and T2 are connected by means of two transistors T3 and T4 operating as emitter followers. As FIG. 3 shows, the first emitter follower T3 is connected to the collector of the transistor T1 by its base and to the base of the transistor T2 by its emitter. The second emitter follower T4 is connected by its base to the collector of the transistor T2 and by its emitter to the base of the transistor T1. The collectors of the transistors T3 and T4 are connected to the supply voltage. In addition the resistors R5 and R6 (which are not shown in FIG. 3) can be provided in the arrangement according to FIG. 2. In this form of the invention, the quiscent potential of the collectors of the transistors T1 and T2 is higher by the base emitter voltage of the transistor T3 and T4 and consequently correspondingly greater modulation is possible.

The exclusive use of npn transistors provides favourable electrical and design conditions for its implementation as a monolithically integrated semi-conductor block. The use of pnp transistors is also possible if all of the voltages and currents are reversed.

It will be understood that the above description of the present invention is susceptible to various modification changes and adaptations.

What is claimed is:

1. A feedback amplifier including a current-fed differential stage having first and second outputs, said feedback amplifier additionally comprising a first transistor having an emitter connected to the first output of the differential stage; a second transistor having an emitter connected to the second output of the differential stage; a first resistor connected between both the outputs of the differential stage; a source of supply voltage; and second and third resistors comprising operating resistors connected between said supply voltage source and said two transistors, wherein said second resistor is connected to the collector of said first transistor [and the base of said second transistor], [and] said third resistor is connected to the collector of said second transistor [and the base of said first transistor] *said feedback amplifier further including first and second feedback amplifier output means consisting of the collectors of said first and second transistors, respectively.*

[2. A feedback amplifier as defined in claim 1, and comprising a fourth resistor connecting the base of said first transistor to the collector of said second transistor and a fifth resistor connecting the base of said second transistor to the collector of said first transistor.]

3. [A feedback amplifier as defined in claim 2, and comprising] *A feedback amplifier including a current-fed differential stage having first and second outputs, said feedback amplifier additionally comprising a first transistor having an emitter connected to the first output of the differential stage; a second transistor having an emitter connected to the second output of the differential stage; a first resistor connected between both the outputs of the differential stage; a source of supply voltage; second and third resistors comprising operating resistors connected between said supply voltage source and said two transistors, wherein said second resistor is connected to the collector of said first transistor and said third resistor is connected to the collector of said second transistor; a fourth resistor connecting the base of said first transistor to the collector of said second transistor; a fifth resistor connecting the base of said second transistor to the collector of said first transistor;* a sixth resistor between the base and the emitter of said first transistor and a seventh resistor between the base and the emitter of said second transistor.

4. A feedback amplifier as defined in claim [1 or] 3, and comprising third and fourth transistors operating as emitter followers and each having an emitter connected to a respective one of the bases of said first and second transistors.

5. A feedback amplifier as defined in claim 4, and comprising connection means for connecting the collectors of said third and fourth transistors respectively to said supply voltage source, the base of said third transistor to the collector of said [first] *second* transistor and the base of said fourth transistor to the collector of said [second] *first* transistor.

[6. A feedback amplifier comprising a current fed differential stage, a first transistor having an emitter connected to a first output of said differential stage, a second transistor having an emitter connected to a second output of said differential stage, a first resistor connected between both said first and second outputs of said differential stage, a third resistor forming an operating resistor connected between a supply voltage and the collector of said first transistor and the base of said second transistor and a fourth resistor forming an operating resistor connected between said supply voltage and the collector of said second transistor and the base of said first transistor.]

*7. A feedback amplifier including a current-fed differential stage having first and second voltage inputs and first and second outputs, said feedback amplifier additionally comprising a first transistor having an emitter connected to the first output of the differential stage; a second transistor having an emitter connected to the second output of the*

*differential stage; first and second feedback amplifier output means consisting of the collectors of said first and second transistors, respectively; a first resistor connected between both the outputs of the differential stage; a source of supply voltage; and second and third resistors comprising operating resistors connected between said supply voltage source and said two transistors, wherein said second resistor is connected to the collector of said first transistor and the base of said second transistor, said third resistor is connected to the collector of said second transistor and the base of said first transistor, and said first resistor has a resistance value that is selected based upon desired values of voltages at said first and second voltage inputs at which current from said current-fed differential stage is switched over from one of said second and third resistors to the other of such resistors.*

*8. A feedback amplifier as defined in claim 7, and comprising a fourth resistor connecting the base of said first transistor to the collector of said second transistor and a fifth resistor connecting the base of said second transistor to the collector of said first transistor.*

*9. A feedback amplifier including a current-fed differential stage having first and second outputs, said feedback amplifier additionally comprising a first transistor having an emitter connected to the first output of the differential stage; a second transistor having an emitter connected to the second output of the differential stage; a first resistor connected between both the outputs of the differential stage; a source of supply voltage; third and fourth transistors operating as emitter followers and each having an emitter connected to a respective one of the bases of said first and second transistors; and second and third resistors comprising operating resistors connected between said supply voltage source and said two transistors, wherein said second resistor is connected to the collector of said first transistor and, via said fourth transistor, to the base of said second transistor, and said third resistor is connected to the collector of said second transistor and, via said third transistor, to the base of said first transistor.*

*10. A feedback amplifier as defined in claim 9, and comprising connection means for connecting the collectors of said third and fourth transistors respectively to said supply voltage source, the base of said third transistor to the collector of said second transistor and the base of said fourth transistor to the collector of said first transistor.*

* * * * *